US010680517B1

(12) United States Patent
Qiao

(10) Patent No.: US 10,680,517 B1
(45) Date of Patent: Jun. 9, 2020

(54) RECONFIGURABLE VOLTAGE REGULATOR

(71) Applicant: Yangtze Memory Technologies Co., Ltd., Wuhan, Hubei Province (CN)

(72) Inventor: Liang Qiao, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/432,940

(22) Filed: Jun. 6, 2019

Related U.S. Application Data

(63) Continuation of application No. PCT/CN2019/082058, filed on Apr. 10, 2019.

(51) Int. Cl.
*H02M 3/07* (2006.01)
*G11C 16/30* (2006.01)

(52) U.S. Cl.
CPC .............. *H02M 3/073* (2013.01); *G11C 16/30* (2013.01)

(58) Field of Classification Search
CPC .. H02M 3/073; H02M 2003/077; H02M 3/07; G11C 16/30
See application file for complete search history.

(56) References Cited

U.S. PATENT DOCUMENTS

| | | | |
|---|---|---|---|
| 6,100,752 A | 8/2000 | Lee | |
| 6,297,687 B1 * | 10/2001 | Sugimura | H02M 3/073 323/313 |
| 6,486,728 B2 | 11/2002 | Kleveland | |
| 6,765,428 B2 * | 7/2004 | Kim | H02M 3/073 327/534 |
| 6,967,523 B2 | 11/2005 | DeMone | |
| 7,274,248 B2 * | 9/2007 | Okamoto | G11C 5/145 327/536 |
| 7,795,951 B2 * | 9/2010 | Choy | H02M 3/073 327/536 |
| 7,973,592 B2 * | 7/2011 | Pan | H02M 3/073 327/536 |
| 9,135,843 B2 | 9/2015 | Farenc | |
| 9,515,548 B2 | 12/2016 | Good | |
| 2002/0008568 A1 | 1/2002 | Sugimura | |
| 2002/0130701 A1 | 9/2002 | Kleveland | |

FOREIGN PATENT DOCUMENTS

| | | |
|---|---|---|
| CN | 1541393 A | 10/2004 |
| CN | 1688951 A | 10/2005 |
| CN | 1906832 A | 1/2007 |
| CN | 101154464 A | 4/2008 |
| CN | 101266592 A | 9/2008 |

(Continued)

*Primary Examiner* — Jung Kim
(74) *Attorney, Agent, or Firm* — Winston Hsu

(57) ABSTRACT

A reconfigurable voltage regulator for use in a system having a multiple power domains includes a power detecting circuit and a charge pump. The power detecting circuit is coupled to a power supply and configured to partition a power range of the power supply into multiple voltages zones corresponding to the multiple power domains of the system and provide a pump enable signal associated with a specific power domain among the multiple power domains. The charge pump includes multiple pump stages arranged in a matrix, wherein each pump stage is activated or deactivated according to a corresponding bit of the pump enable signal.

10 Claims, 9 Drawing Sheets

(56) References Cited

FOREIGN PATENT DOCUMENTS

| | | | |
|---|---|---|---|
| CN | 101617472 | A | 12/2009 |
| CN | 103578549 | A | 2/2014 |
| CN | 103715882 | A | 4/2014 |
| CN | 105210278 | A | 12/2015 |
| CN | 104364837 | B | 12/2017 |
| TW | 533667 | | 5/2003 |
| TW | 586122 | | 5/2004 |

\* cited by examiner

US 10,680,517 B1

RECONFIGURABLE VOLTAGE REGULATOR

CROSS REFERENCE TO RELATED APPLICATIONS

This application is a continuation of International Application No. PCT/CN2019/082058 filed on 2019 Apr. 10.

BACKGROUND OF THE INVENTION

1. Field of the Invention

The present invention is related to a reconfigurable voltage regulator, and more particularly, to a reconfigurable voltage regulator for use in a system having multiple power domains.

2. Description of the Prior Art

Many portable products, such as cell phones, laptop computers, personal data assistants (PDAs) and the like, utilize a processing system that executes programs, such as communication and multimedia programs. A processing system for such products may include multiple processors, complex memory systems including multi-levels of caches and memory for storing instructions and data, controllers, peripheral devices such as communication interfaces, and fixed function logic blocks configured, for example, on a single chip. At the same time, portable products have a limited energy source in the form of batteries that are often required to support high performance operations by the processing system and increasingly large memory capacities as functionality increases. Such concerns extend to personal computer products which are also being developed with efficient designs to operate with reduced overall energy consumption.

In such portable systems, one or more low-dropout (LDO) voltage regulators, also referred to as LDO regulators, are generally embedded on a power management chip to regulate one or more voltages for circuits on one or more chips. Each LDO regulator of the multiple LDO regulators is used to regulate a voltage for circuits in a specific power domain. For example, a portable cell phone may adopt flash memory which requires various high voltages for read, program and erase operations. These voltages are generated by charge pumps which are based on an internal power supply generated by an LDO regulator.

The major minus of prior art LDO solution is the downgraded power efficiency of portable systems. Also, the need to use many decoupling capacitors for compensating AC or transient performance leads to increased die size.

SUMMARY OF THE INVENTION

The present invention is related to a reconfigurable voltage regulator for use in a system having a plurality of power domains. The reconfigurable voltage regulator includes a power detecting circuit and a charge pump. The power detecting circuit is coupled to a power supply and configured to partition a power range of the power supply into a plurality of voltages zones corresponding to the plurality of power domains of the system and provide a pump enable signal associated with a first power domain among the plurality of power domains. The charge pump includes a plurality of pump stages arranged in a matrix defined by a first row to an $M^{th}$ row and a first column to an $N^{th}$ column, wherein M and N are integers larger than 1. Each pump stage is activated or deactivated according to a corresponding bit of the pump enable signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
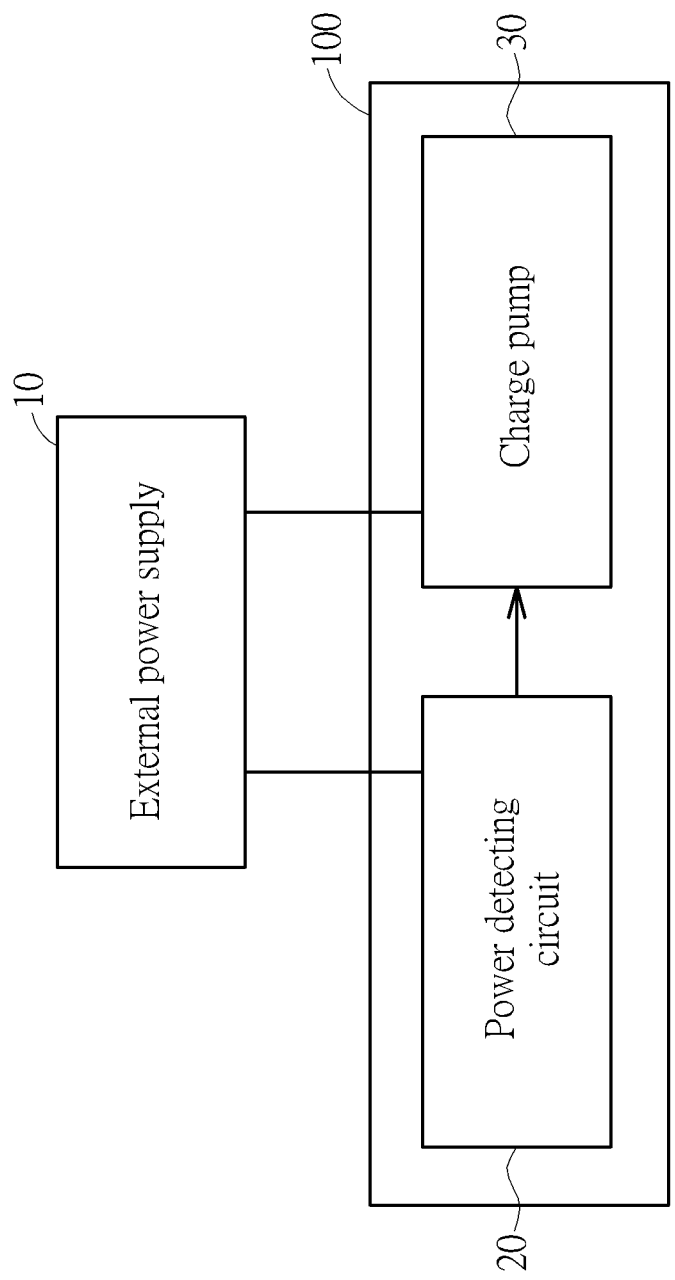
FIG. 1 is a functional diagram illustrating a reconfigurable voltage regulator for use in a system of multiple power domains according to an embodiment of the present invention.

FIG. 1 is a functional diagram illustrating a reconfigurable voltage regulator 100 for use in a system of multiple power domains according to an embodiment of the present invention. The reconfigurable voltage regulator 100 includes a power detecting circuit 20 and a charge pump 30 whose operations are sustained by an external power supply 10. The power detecting circuit 20 is configured to partition the whole power range of the external power supply 10 into multiple voltages zones corresponding to the multiple power domains of the system. The charge pump 30 is reconfigurable for each voltage zone and configured to behave like power based voltage multiplier, thereby achieving the optimized power efficiency among the whole power range of the system.

Figure 2:
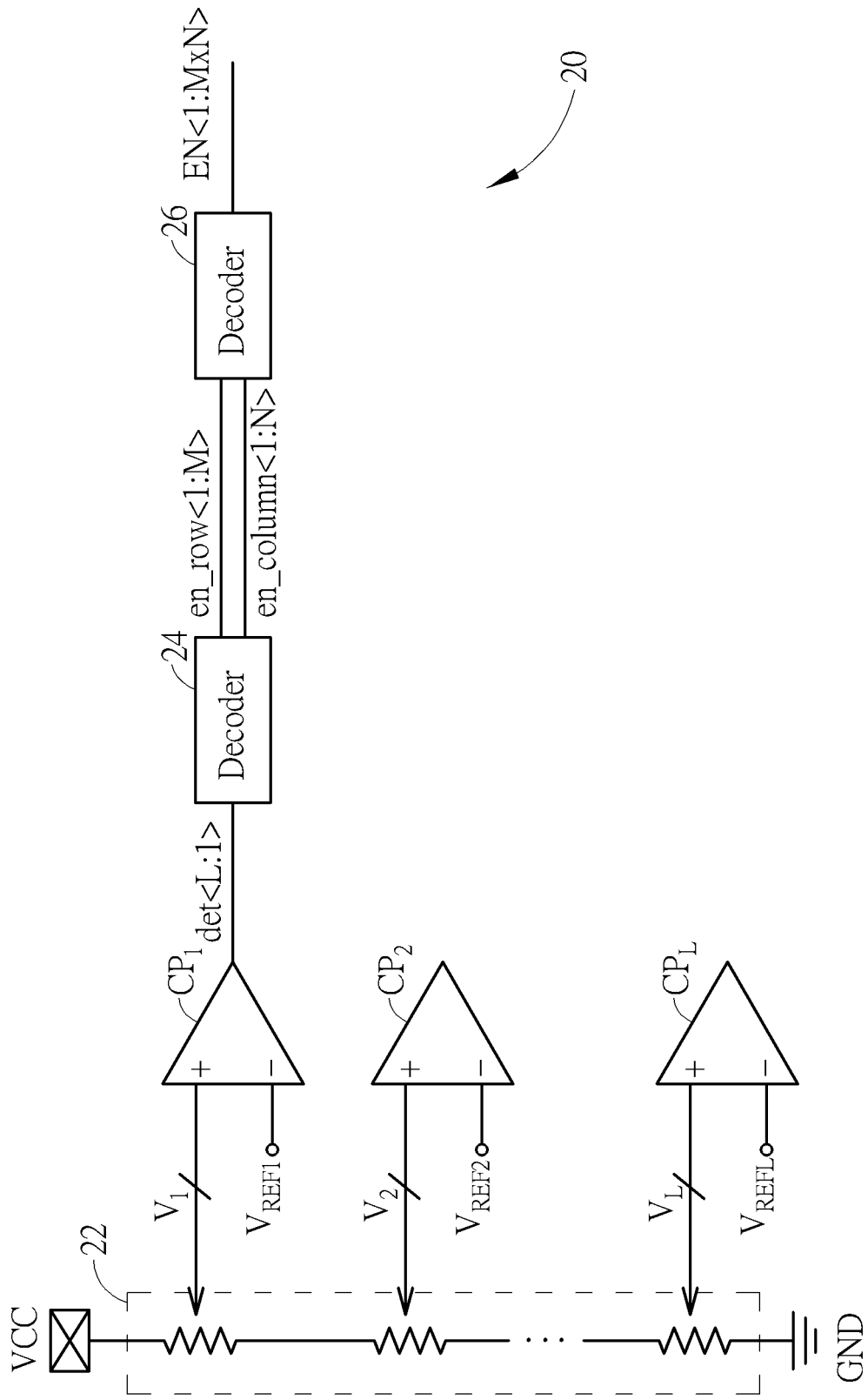
FIG. 2 is a diagram illustrating an implementation of a power detecting circuit of a reconfigurable voltage regulator for use in a system of multiple power domains according to an embodiment of the present invention.

FIG. 2 is a diagram illustrating an implementation of the power detecting circuit 20 of the reconfigurable voltage regulator 100 for use in a system of L (L is an integer larger than 1) power domains according to an embodiment of the present invention. The power detecting circuit 20 includes a voltage divider 22, comparators $CP_1 \sim CP_L$, a first decoder 24 and a second decoder 26. The voltage divider 22 may include a plurality of resistors coupled in series between a bias voltage VCC provided by the external power supply 10 and a ground voltage GND, wherein L tap voltages $V_1 \sim V_L$ are provided between two adjacent resistors. Each of the comparators $CP_1 \sim CP_L$ includes a positive input end coupled to receive a corresponding tap voltage, a negative input end coupled to a corresponding reference voltage ($V_{REF1} \sim V_{REFL}$), and an output end. Each comparator is configured to output a logic 1 signal when the tap voltage received at its positive input end is higher than the reference voltage received at its negative input end; each comparator is configured to output a logic 0 signal when the tap voltage received at its positive input end is not higher than the reference voltage received at its negative input end. All output signals of the comparators $CP_1 \sim CP_L$ form an L-bit determination signal det<L:1>. The first decoder 14 is configured to decode the determination signal det<L:1> into a row enable signal en_row<1:M> and a column enable signal en_column<1:N>, wherein M and N are positive integers larger than 1. The second decoder 16 is configured to translate the row enable signal en_row<1:M> and the column enable signal en_column<1:N> into a pump enable signal EN<1:M×N> associated with a specific power domain of the system.

Figure 3:
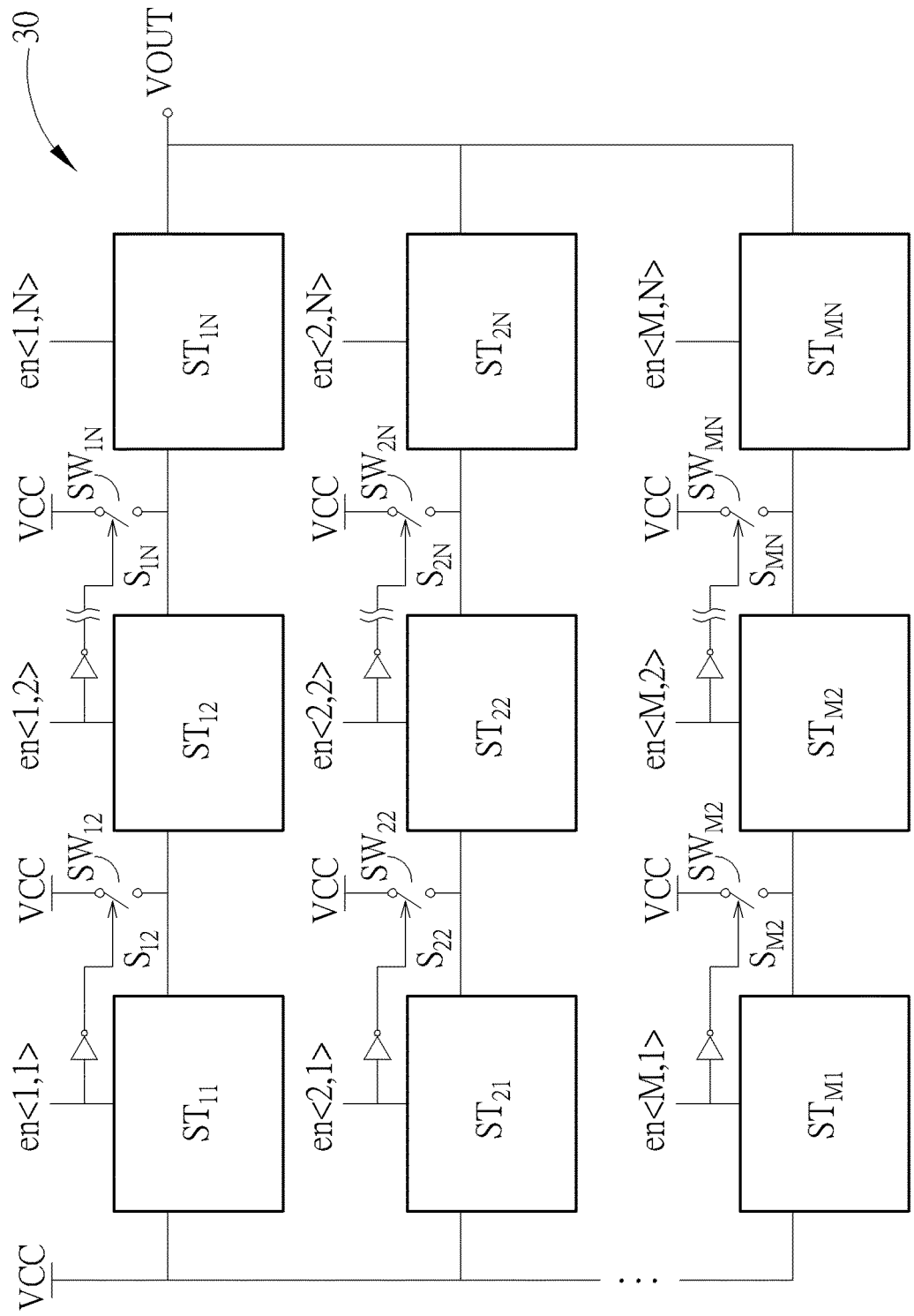
FIG. 3 is a diagram illustrating an implementation of a charge pump of a reconfigurable voltage regulator according to an embodiment of the present invention.

FIG. 3 is a diagram illustrating an implementation of the charge pump 30 according to an embodiment of the present invention. The charge pump 30 includes a plurality of pump stages $ST_{11} \sim ST_{MN}$ arranged in a matrix defined by M rows and N columns and configured to provide a pump output $V_{OUT}$. The pump stages $ST_{11} \sim ST_{M1}$ on the $1^{st}$ column are coupled to the bias voltage VCC provided by the external power supply 10. Each of the pump stages $ST_{12} \sim ST_{M2}$ on the $2^{nd}$ column to the pump stages $ST_{1N} \sim ST_{MN}$ on the $N^{th}$ column are selectively coupled to the bias voltage VCC via respective switches $SW_{12} \sim SW_{M2}$ to $ST_N \sim ST_{MN}$. The pump stages $ST_{11} \sim ST_{MN}$ are enabled or disabled by corresponding bits en<1,1>~en<M,N> of the pump enable signal EN<1:M×N> generated by the power detecting circuit 10. The switches $SW_{12} \sim SW_{M2}$ to $ST_N \sim ST_{MN}$ are turned on or off by control signals $S_{12} \sim S_{M2}$ to $S_{1N} \sim S_{MN}$, respectively.

FIGS. 4-8 are diagrams illustrating the operation of the reconfigurable voltage regulator 100 according to embodiments of the present invention. The number of M and N is reconfigurable for each of the L power domains in the system. For illustrative purpose, FIGS. 4-8 depict the embodiment when M=2 and N=3. However, the number of M and N does not limit the scope of the present invention.

In the embodiment illustrated in FIGS. 4-8, the pump stages $ST_{11}$, $ST_{12}$, $ST_{13}$, $ST_{21}$, $ST_{22}$, and $ST_{23}$ are enabled or disabled by corresponding bits en<1,1>, en<1,2>, en<1,3>, en<2,1>, en<2,2> and en<2,3> of the pump enable signal EN<1:6> generated by the power detecting circuit 10. The pump stages $ST_{11}$ and $ST_{21}$ on the first column of the matrix are directly coupled to the bias voltage VCC. The pump stages $ST_{12}$, $ST_{13}$, $ST_{22}$, and $ST_{23}$ on the second and third columns of the matrix are coupled to the bias voltage VCC via respective switches $SW_{12}$, $SW_{13}$, $SW_{22}$, and $SW_{23}$, which are turned on or off by the control signals $S_{12}$, $S_{13}$, $S_{22}$, and $S_{23}$, respectively. In the present invention, the control signals $S_{12}$, $S_{13}$, $S_{22}$, and $S_{23}$ are provided by inverting the bits en<1,1>, en<1,2>, en<2,1> and en<2,2> of the pump enable signal EN<1:6>, respectively. More specifically, for the pump stages on the same row of the matrix, a pump stage on the $(n+1)^{th}$ column of the matrix is coupled to the bias voltage VCC via its corresponding turned-on switch when a pump stage on the $n^{th}$ column of the matrix is deactivated, or isolated from the bias voltage VCC by its corresponding turned-off switch when a pump stage on the $n^{th}$ column of the matrix is activated, wherein n is an integer between 2 and N.

Figure 4:
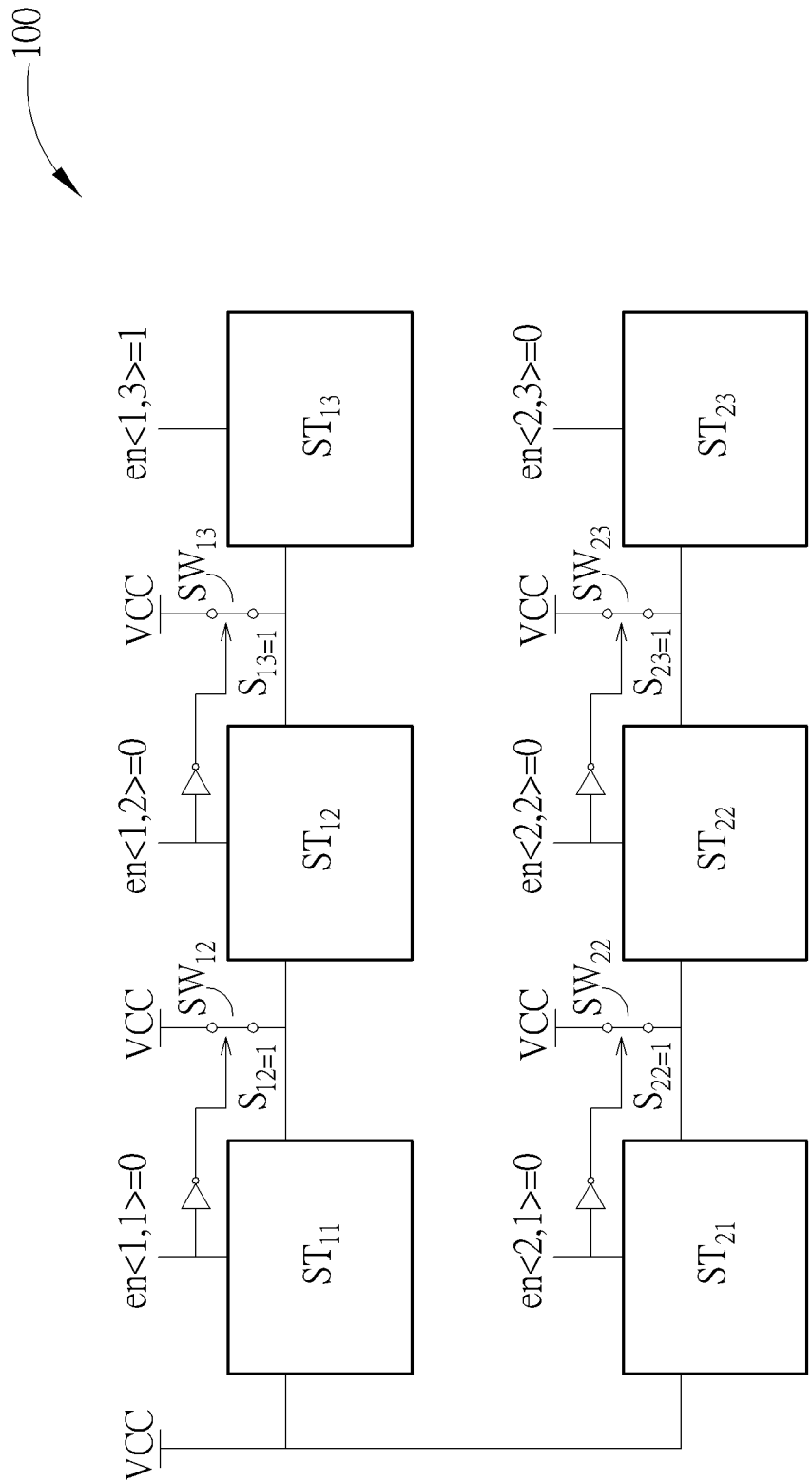
FIG. 4 is a diagram illustrating the operation of a reconfigurable voltage regulator according to an embodiment of the present invention.

In the embodiment depicted in FIG. 4, it is assumed that the bias voltage VCC is at the maximum value of 3.6V. Under such circumstance, each bit of the determination signal det<L:1> output by the comparators $CP_1 \sim CP_L$ is logic 1. After the first decoder 24 decodes the determination signal det<L:1>, the row enable signal en_row<1:2> is equal to 2'b10 in Verilog and the column enable signal en_column<1:3> is equal to 3'b100 inVerilog. After the second decoder 26 translates the row enable signal en_row<1:2> and the column enable signal en_column<1:3>, the pump enable signal EN<1:6> is equal to 6'b001000 in Verilog. As depicted in FIG. 4, the pump stages $ST_{11}$, $ST_{12}$, $ST_{13}$, $ST_{21}$, $ST_{22}$ and $ST_{23}$ are controlled by bits en<1,1>, en<1,2>, en<1,3>, en<2,1>, en<2,2> and en<2,3> of the pump enable signal EN<1:6>, respectively. Therefore, only the pump stages $ST_{13}$ is activated as indicated by the bit en<1,3> having an enable level of logic 1. Also, since bits en<1,1>, en<1,2>, en<2,1> and en<2,2> are at a disable level of logic 0, the control signals $S_{12}$, $S_{13}$, $S_{22}$, and $S_{23}$ having an enable level of logic 1 turn on the switches $SW_{12}$, $SW_{13}$, $SW_{22}$ and $SW_{23}$, thereby coupling the pump stages $ST_{12}$, $ST_{13}$, $ST_{22}$ and $ST_{23}$ to the bias voltage VCC.

Figure 5:
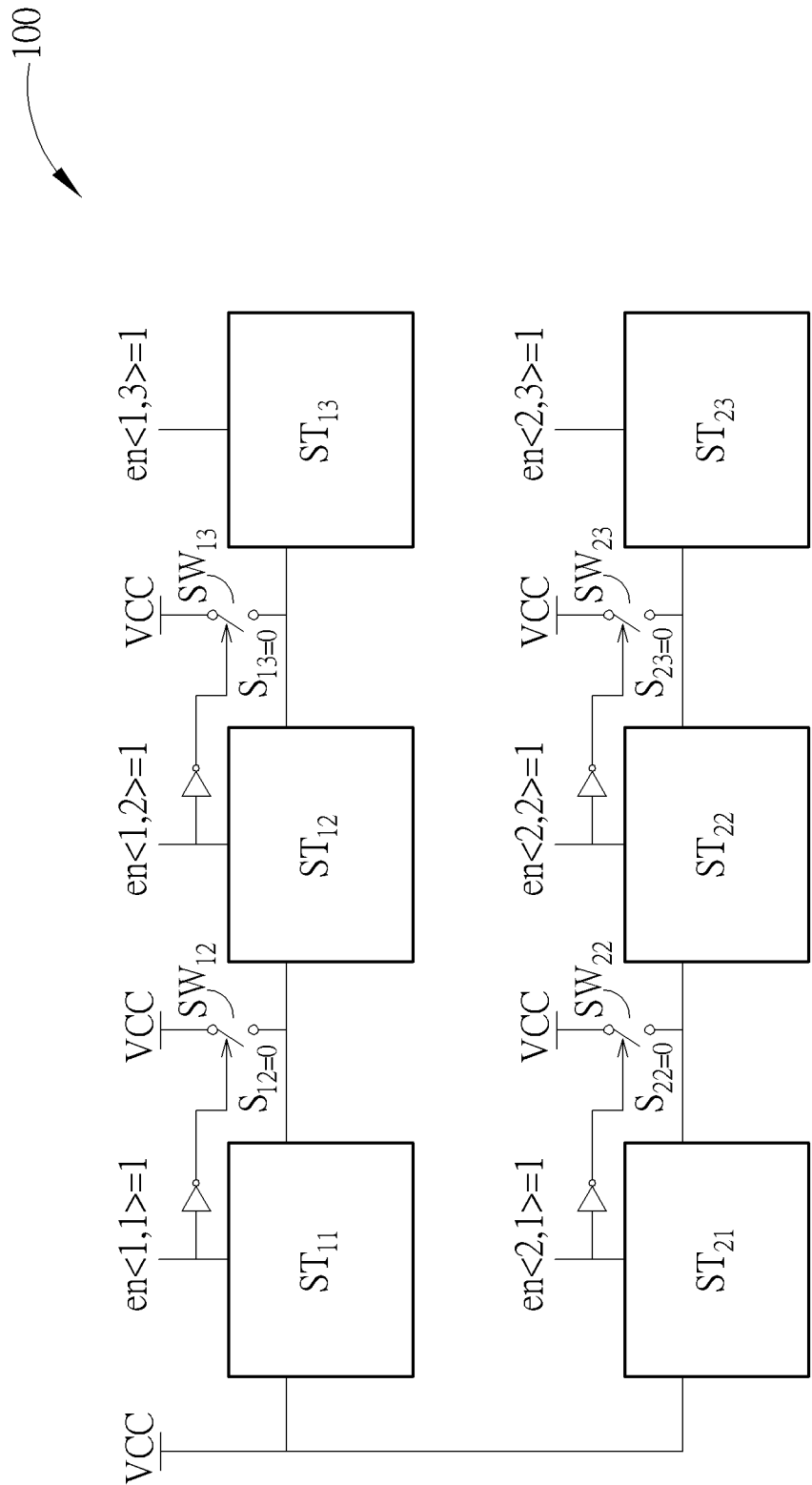
FIG. 5 is a diagram illustrating the operation of a reconfigurable voltage regulator according to another embodiment of the present invention.

In the embodiment depicted in FIG. 5, it is assumed that the bias voltage VCC is at the minimal value of 1.6V. Under such circumstance, each bit of the determination signal det<L:1> output by the comparators $CP_1 \sim CP_L$ is logic 0. After the first decoder 24 decodes the determination signal det<L:1>, the row enable signal en_row<1:2> is equal to 2'b11 in Verilog and the column enable signal en_column<1:3> is equal to 3'b111 inVerilog. After the second decoder 26 translates the row enable signal en_row<1:2> and the column enable signal en_column<1:3>, the pump enable signal EN<1:6> is equal to 6'b111111 in Verilog. As depicted in FIG. 5, the pump stages $ST_{11}$, $ST_{12}$, $ST_{13}$, $ST_{21}$, $ST_{22}$ and $ST_{23}$ are controlled by bits en<1,1>, en<1,2>, en<1,3>, en<2,1>, en<2,2> and en<2,3> of the pump enable signal EN<1:6>, respectively. Therefore, all the pump stages $ST_{11}$, $ST_{12}$, $ST_{13}$, $ST_{21}$, $ST_{22}$ and $ST_{23}$ are activated as indicated by the bits en<1,1>, en<1,2>, en<1,3>, en<2,1>, en<2,2> and en<2,3> having an enable level of logic 1. Also, the control signals $S_{12}$, $S_{13}$, $S_{22}$, and $S_{23}$ having a disable level of logic 0 turn off the switches $SW_{12}$, $SW_{13}$, $SW_{22}$ and $SW_{23}$, thereby isolating the pump stages $ST_{12}$, $ST_{13}$, $ST_{22}$ and $ST_{23}$ from the bias voltage VCC.

Figure 6:
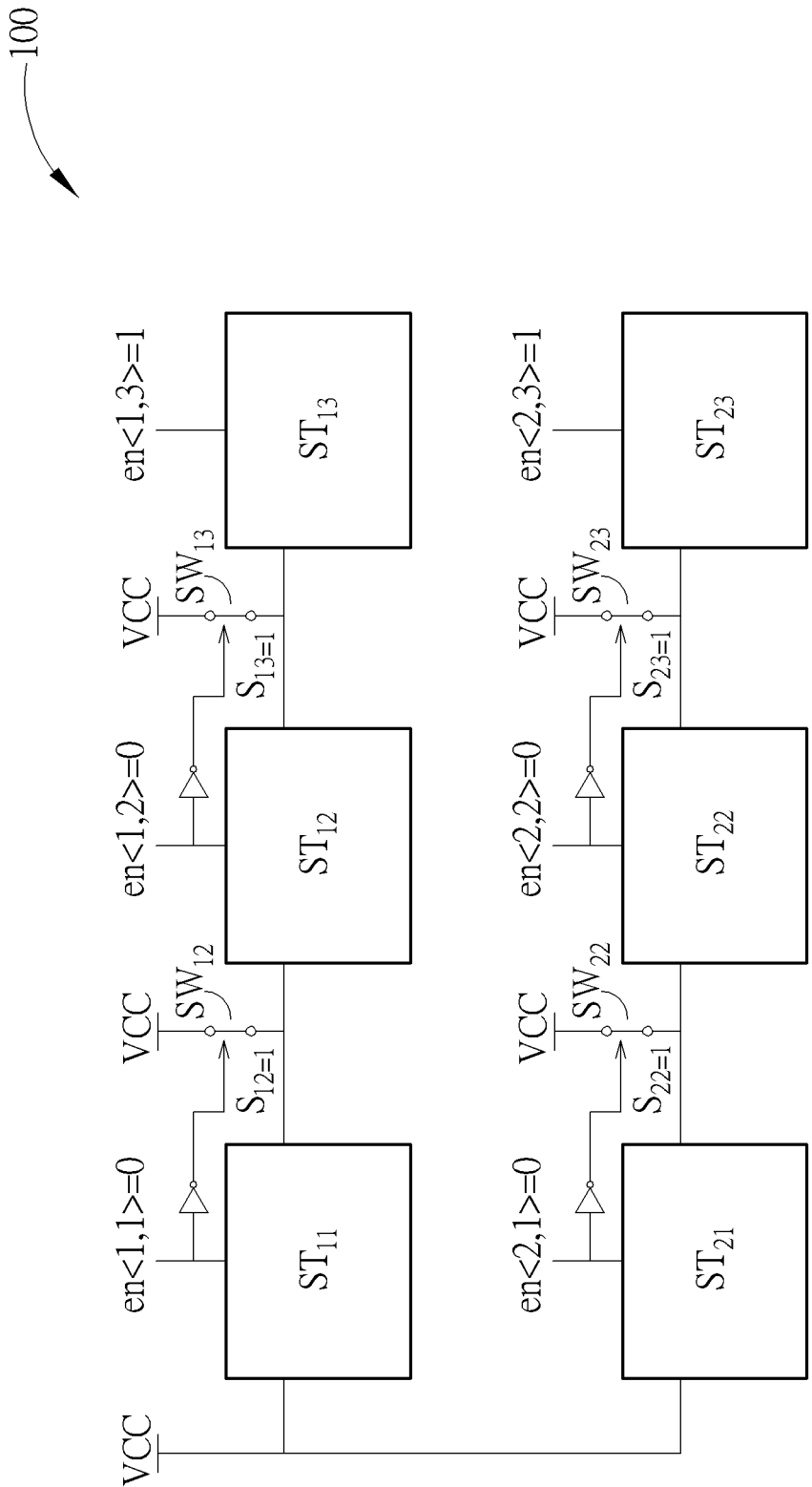
FIG. 6 is a diagram illustrating the operation of a reconfigurable voltage regulator according to another embodiment of the present invention.

In the embodiment depicted in FIG. 6, it is assumed that the voltage VCC is at a value which requires voltage amplification by two pump stages. Under such circumstance, the pump enable signal EN<1:6> may be equal to 6'b001001 in Verilog. As depicted in FIG. 6, the pump stages $ST_{11}$, $ST_{12}$, $ST_{13}$, $ST_{21}$, $ST_{22}$ and $ST_{23}$ are controlled by bits en<1,1>, en<1,2>, en<1,3>, en<2,1>, en<2,2> and en<2,3> of the pump enable signal EN<1:6>, respectively. Therefore, only the pump stages $ST_{13}$ and $ST_{23}$ are activated as indicated by the bits en<1,3> and en<2,3> each having an enable level of logic 1. Also, since bits en<1,1>, en<1,2>, en<2,1> and en<2,2> are each at a disable level of logic 0, the control signals $S_{12}$, $S_{13}$, $S_{22}$, and $S_{23}$ each having an enable level of logic 1 turn on the switches $SW_{12}$, $SW_{13}$, $SW_{22}$ and $SW_{23}$, thereby coupling the pump stages $ST_{12}$, $ST_{13}$, $ST_{22}$ and $ST_{23}$ to the bias voltage VCC.

Figure 7:
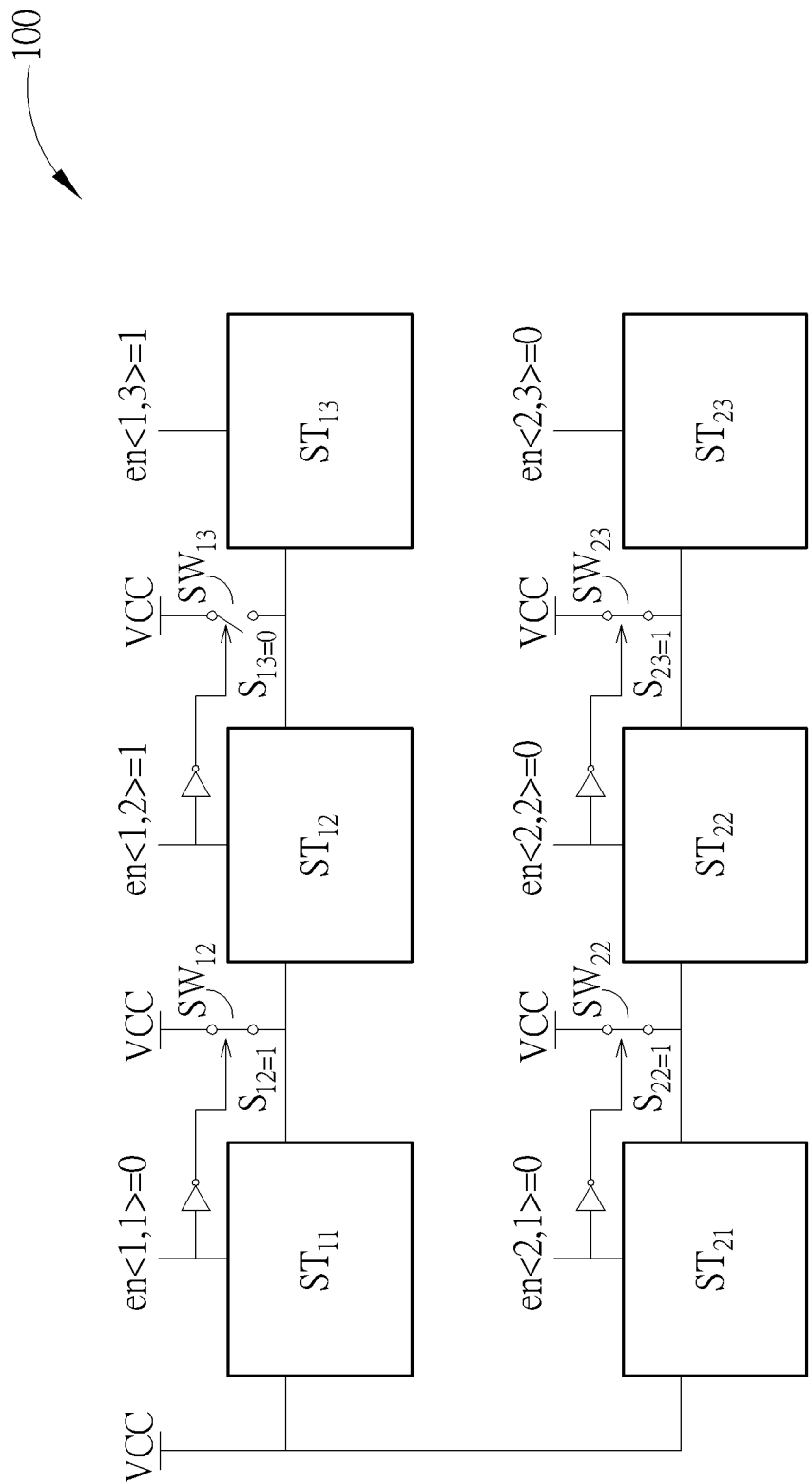
FIG. 7 is a diagram illustrating the operation of a reconfigurable voltage regulator according to another embodiment of the present invention.

In the embodiment depicted in FIG. 7, it is assumed that the voltage VCC is at a value which requires voltage amplification by two pump stages. Under such circumstance, the pump enable signal EN<1:6> may be equal to 6'b011000 in Verilog. As depicted in FIG. 7, the pump stages $ST_{11}$, $ST_{12}$, $ST_{13}$, $ST_{21}$, $ST_{22}$ and $ST_{23}$ are controlled by bits en<1,1>, en<1,2>, en<1,3>, en<2,1>, en<2,2> and en<2,3> of the pump enable signal EN<1:6>, respectively. Therefore, only the pump stages $ST_{12}$ and $ST_{13}$ are activated as indicated by the bits en<1,2> and en<1,3> each having an enable level of logic 1. Also, since bits en<1,1>, en<2,1> and en<2,2> are each at a disable level of logic 0, the control signals $S_{12}$, $S_{22}$, and $S_{23}$ each having an enable level of logic 1 turn on the switches $SW_{12}$, $SW_{22}$ and $SW_{23}$, thereby coupling the pump stages $ST_{12}$, $ST_{22}$ and $ST_{23}$ to the bias voltage VCC. Since bit en<1,2> is at an enable level of logic 1, the control signals $S_{13}$ having a disable level of logic 0 turn off the switches $SW_{13}$, thereby isolating the pump stages $ST_{13}$ from the bias voltage VCC.

Figure 8:
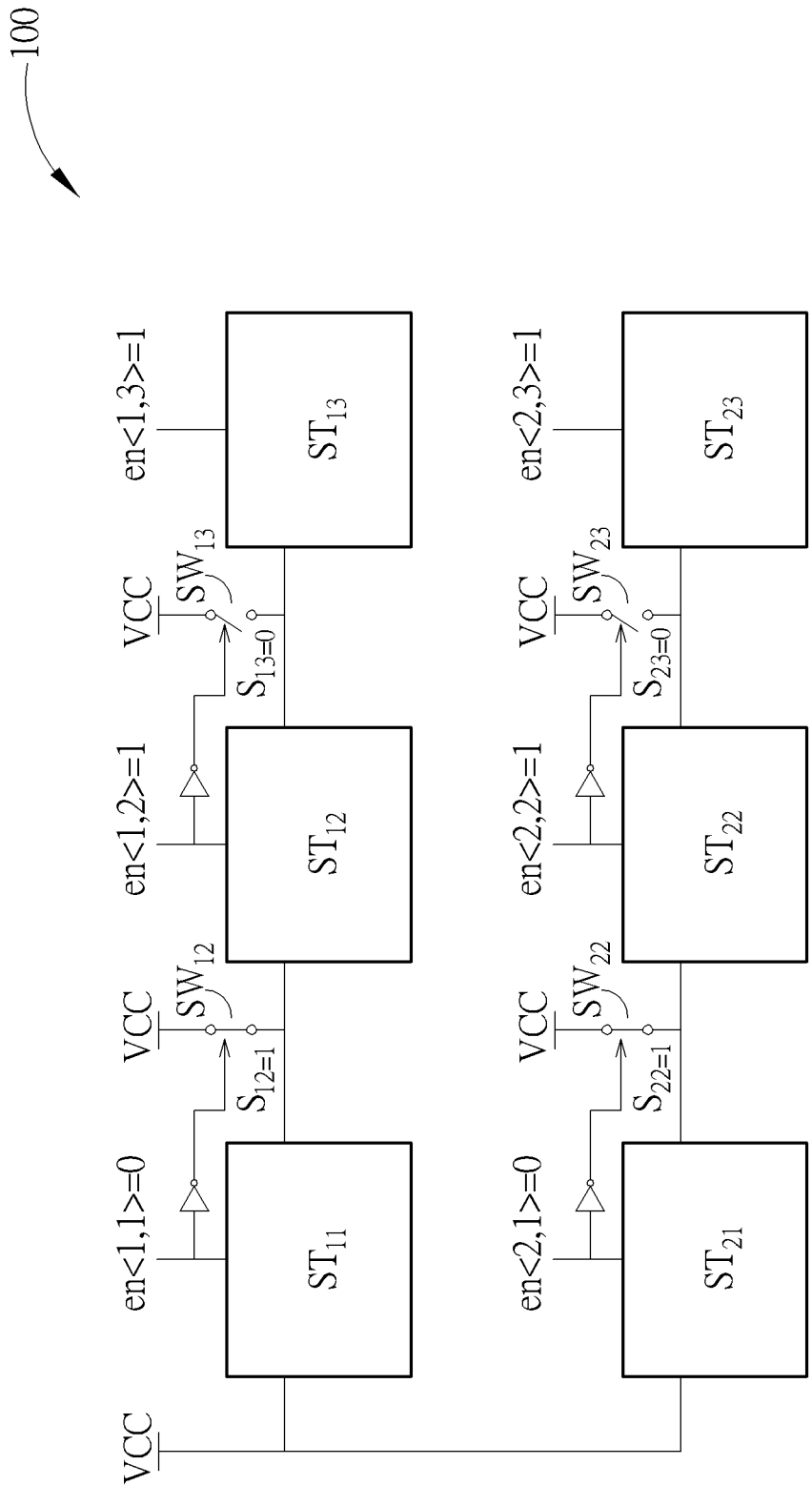
FIG. 8 is a diagram illustrating the operation of a reconfigurable voltage regulator according to another embodiment of the present invention.

In the embodiment depicted in FIG. 8, it is assumed that the voltage VCC is at a value which requires voltage amplification by four pump stages. Under such circumstance, the pump enable signal EN<1:6> may be equal to 6'b011011 in Verilog. As depicted in FIG. 8, the pump stages $ST_{11}$, $ST_{12}$, $ST_{13}$, $ST_{21}$, $ST_{22}$ and $ST_{23}$ are controlled by bits en<1,1>, en<1,2>, en<1,3>, en<2,1>, en<2,2> and en<2,3> of the pump enable signal EN<1:6>, respectively. Therefore, only the pump stages $ST_{12}$, $ST_{13}$, $ST_{22}$ and $ST_{23}$ are activated as indicated by the bits en<1,2>, en<1,3>, en<2,2> and en<2,3> each having an enable level of logic 1. Also, since bits en<1,1> and en<2,1> are each at a disable level of logic 0, the control signals $S_{12}$ and $S_{22}$ each having an enable level of logic 1 turn on the switches $SW_{12}$ and $SW_{22}$, thereby coupling the pump stages $ST_{12}$ and $ST_{22}$ to the bias voltage VCC. Since bit en<1,2> and en<2,2> are each at an enable level of logic 1, the control signals $S_{13}$ and $S_{23}$ each having a disable level of logic 0 turn off the switches $SW_{13}$ and $SW_{23}$, thereby isolating the pump stages $ST_{13}$ and $ST_{23}$ from the bias voltage VCC.

Figure 9:
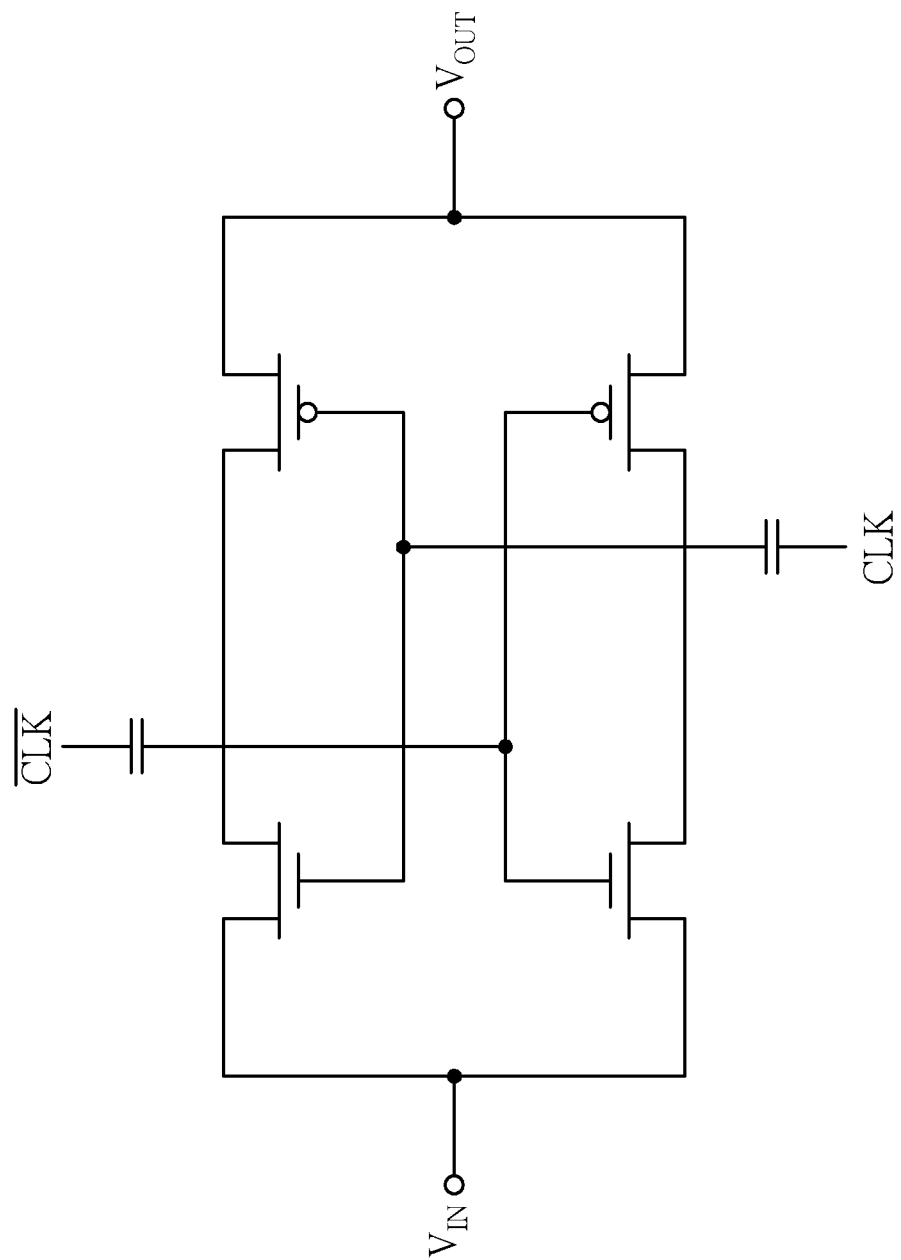
FIG. 9 is a diagram illustrating an implementation of each pump stage according to an embodiment of the present invention.

In the present invention, each of the pump stages $ST_{11}$~$ST_{MN}$ may be a voltage multiplier. FIG. 9 is a diagram illustrating an implementation of each pump stage according to an embodiment of the present invention. In the embodiment illustrated in FIG. 9, each pump stage may be implemented as a Pelliconi voltage doubler configured to provide an output voltage $V_{OUT}$ by amplifying an input voltage $V_{IN}$ by a factor of 2. However, the implementation of the pump stages $ST_{11}$~$ST_{MN}$ does not limit the scope of the present invention.

In the reconfigurable voltage regulator 100 according to the present invention, the power detecting circuit 20 may detect the current level of the external power supply 10 on a real-time basis. When a chip implemented with the present reconfigurable voltage regulator 100 is applied to a system having multiple power domains, the charge pump 30 may be spontaneously reconfigured for providing a corresponding output voltage $V_{OUT}$ associated with the current power domain. When the power source of a system implemented with the present reconfigurable voltage regulator 100 changes, such as when a Lithium-based battery delivers less energy over time, the charge pump 30 may be spontaneously reconfigured for providing a corresponding output voltage $V_{OUT}$ associated with the current power domain.

In the reconfigurable voltage regulator according to the present invention, the whole power range of an external power supply may be partitioned into multiple voltages zones corresponding to the multiple power domains of a system. Each charge pump in the reconfigurable voltage regulator may be reconfigured for each voltage zone and configured to behave like power based voltage multiplier for providing the required voltage to each power domain. The reconfigurable voltage regulator according to the present invention may be applied to sustain the operation of wide power range flash memory, thereby achieving the optimized power efficiency among the whole power range of the system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A reconfigurable voltage regulator for use in a system having a plurality of power domains, comprising:
   a power detecting circuit coupled to a power supply and configured to partition a power range of the power supply into a plurality of voltages zones corresponding to the plurality of power domains of the system, the power detecting circuit comprising:
      a voltage divider coupled in series between a bias voltage provided by the power supply and a ground voltage for providing a plurality of tap voltages associated with the plurality of power domains;
      a plurality of comparator each configured to output a logic signal according to a corresponding tap voltage among the plurality of tap voltages;
      a first decoder configured to:
         receive a determination signal which includes the logic signal outputted by each comparator; and
         decode the determination signal into an M-bit row enable signal and an N-bit column enable signal associated with a first power domain among the plurality of power domains; and
      a second decoder configured to translate the M-bit row enable signal and the N-bit column enable signal into a pump enable signal having M×N bits and associated with the first power domain; and
   a charge pump comprising a plurality of pump stages arranged in a matrix defined by a first row to an $M^{th}$ row and a first column to an $N^{th}$ column, wherein:
      each pump stage is activated or deactivated according to a corresponding bit of the pump enable signal; and
      M and N are integers larger than 1.

2. The reconfigurable voltage regulator of claim 1, wherein each pump stage is a voltage multiplier implemented as a diode rectifier circuit which includes diodes and capacitors.

3. The reconfigurable voltage regulator of claim 1, further comprising a plurality of switches, wherein:
   each pump stage on the first column of the matrix is coupled to a bias voltage provided by the power supply; and
   each pump stage on the second to $N^{th}$ columns of the matrix is selectively coupled to the bias voltage via a corresponding switch among the plurality of switches.

4. The reconfigurable voltage regulator of claim 3, wherein:
   a switch which selectively couples a pump stage on an $m^{th}$ row and an $(n+1)^{th}$ column of the matrix to the bias voltage is turned on when a pump stage on the $m^{th}$ row and an $n^{th}$ column of the matrix is deactivated, or is turned off when the pump stage on the $m^{th}$ row and the $n^{th}$ column of the matrix is activated;
   m is an integer between 1 and M; and
   (n+1) is an integer between 2 and N.

5. The reconfigurable voltage regulator of claim 1, wherein:
   a first pump stage on the first row and the $N^{th}$ column of the matrix is activated when the pump enable signal is indicative of a voltage amplification by one pump stage among the plurality of pump stages.

6. The reconfigurable voltage regulator of claim 1, wherein:
a first pump stage on the first row and the $N^{th}$ column of the matrix is activated, a second pump stage on the first row and the $(N-1)^{th}$ column of the matrix is activated, and other pump stages among the plurality of pump stages except the first pump stage and the second pump stage are deactivated when the pump enable signal is indicative of a voltage amplification by two pump stages among the plurality of pump stages.

7. The reconfigurable voltage regulator of claim 1, wherein:
a first pump stage on the first row and the $N^{th}$ column of the matrix is activated, a second pump stage on the second row and the $N^{th}$ column of the matrix is activated, and other pump stages among the plurality of pump stages except the first pump stage and the second pump stage are deactivated when the pump enable signal is indicative of a voltage amplification by two pump stages among the plurality of pump stages.

8. The reconfigurable voltage regulator of claim 1, wherein:
a first pump stage on the first row and the $N^{th}$ column of the matrix is activated, a second pump stage on the first row and the $(N-1)^{th}$ column of the matrix is activated, a third pump stage on the second row and the $N^{th}$ column of the matrix is activated, a fourth pump stage on the second row and the $(N-1)^{th}$ column of the matrix is activated, and other pump stages among the plurality of pump stages except the first pump stage through the fourth pump stages are deactivated when the pump enable signal is indicative of a voltage amplification by four pump stages among the plurality of pump stages.

9. A reconfigurable voltage regulator for use in a system having a plurality of power domains, comprising:
a power detecting circuit coupled to a power supply and configured to:
partition a power range of the power supply into a plurality of voltages zones corresponding to the plurality of power domains of the system; and
provide a pump enable signal associated with a first power domain among the plurality of power domains;
a charge pump comprising a plurality of pump stages arranged in a matrix defined by a first row to an $M^{th}$ row and a first column to an $N^{th}$ column; and
a plurality of switches, wherein:
each pump stage on the first column of the matrix is coupled to a bias voltage provided by the power supply;
each pump stage on the second to $N^{th}$ columns of the matrix is selectively coupled to the bias voltage via a corresponding switch among the plurality of switches;
each pump stage is activated or deactivated according to a corresponding bit of the pump enable signal; and
M and N are integers larger than 1.

10. The reconfigurable voltage regulator of claim 9, wherein:
a switch which selectively couples a pump stage on an $m^{th}$ row and an $(n+1)^{th}$ column of the matrix to the bias voltage is turned on when a pump stage on the $m^{th}$ row and an $n^{th}$ column of the matrix is deactivated, or is turned off when the pump stage on the $m^{th}$ row and the $n^{th}$ column of the matrix is activated;
m is an integer between 1 and M; and
(n+1) is an integer between 2 and N.

* * * * *